United States Patent
Beck et al.

(10) Patent No.: US 7,105,985 B2
(45) Date of Patent: Sep. 12, 2006

(54) MEGASONIC TRANSDUCER WITH FOCUSED ENERGY RESONATOR

(75) Inventors: Mark J. Beck, Los Gatos, CA (US); Richard B. Vennerbeck, Los Gatos, CA (US)

(73) Assignee: Product Systems Incorporated, Campbell, CA (US)

( * ) Notice: Subject to any disclaimer, the term of this patent is extended or adjusted under 35 U.S.C. 154(b) by 462 days.

(21) Appl. No.: 09/964,596

(22) Filed: Sep. 26, 2001

(65) Prior Publication Data

US 2002/0153806 A1 Oct. 24, 2002

Related U.S. Application Data

(63) Continuation-in-part of application No. 09/841,703, filed on Apr. 23, 2001.

(51) Int. Cl.
*H02N 2/00* (2006.01)

(52) U.S. Cl. .............. 310/323.19; 310/323.01; 134/1.3

(58) Field of Classification Search ............ 310/323.01, 310/323.02, 323.12, 323.19, 323, 323.13, 310/325, 367; 134/1.3
See application file for complete search history.

(56) References Cited

U.S. PATENT DOCUMENTS

| | | | | |
|---|---|---|---|---|
| 2,867,777 A | * | 1/1959 | Robinson | 333/142 |
| 3,772,538 A | * | 11/1973 | Supitilov | 310/325 |
| 3,799,652 A | * | 3/1974 | Torguet | 359/313 |
| 4,326,553 A | | 4/1982 | Hall | 134/153 |
| 4,352,570 A | * | 10/1982 | Firth | 241/175 |
| 4,579,000 A | * | 4/1986 | Sudo | 181/107 |
| 4,617,488 A | * | 10/1986 | Nakamura et al. | 310/321 |
| 4,752,918 A | * | 6/1988 | Boucher et al. | 310/322 |
| 4,764,021 A | * | 8/1988 | Eppes | 310/325 |
| 4,848,643 A | * | 7/1989 | Frische et al. | 228/121 |
| 5,010,369 A | * | 4/1991 | Nowak et al. | 310/325 |
| 5,045,746 A | * | 9/1991 | Wersing et al. | 310/322 |
| 5,929,893 A | * | 7/1999 | Son et al. | 347/239 |
| 6,021,785 A | | 2/2000 | Grutzediek et al. | 134/1.3 |
| 6,021,789 A | | 2/2000 | Akatsu et al. | 134/57 |
| 6,039,059 A | | 3/2000 | Bran | 134/105 |
| 6,222,305 B1 | * | 4/2001 | Beck et al. | 310/334 |
| 6,295,999 B1 | | 10/2001 | Bran | 134/1.3 |
| 2003/0024547 A1 | | 2/2003 | Bran et al. | 134/1 |

OTHER PUBLICATIONS

"MHz Ultrasonic Silicon Cleaning Tool", IBM Technical Disclosure Bulletin, vol. 37, No. 06A, p. 585 (Jun. 1, 1994.

* cited by examiner

*Primary Examiner*—Thomas M. Dougherty
(74) *Attorney, Agent, or Firm*—Donald J. Pagel

(57) ABSTRACT

A transducer comprised of a resonator and a piezoelectric crystal for cleaning single items such as semiconductor wafers and flat panel displays. The resonator is an elongated piece of material having a cross section that is trapezoidal in shape. The parallel sides of the trapezoid form the top and bottom ends of the resonator and the nonparallel sides of the trapezoid focus the acoustic energy on the bottom end of the resonator.

14 Claims, 7 Drawing Sheets

MEGASONIC TRANSDUCER WITH FOCUSED ENERGY RESONATOR

This application is a continuation-in-part of Ser. No. 09/841,703, filed Apr. 23, 2001, which claims priority of Ser. No. 09/543,204, filed Apr. 5, 2000, now U.S. Pat. No. 6,222,305.

BACKGROUND OF THE INVENTION

1. Technical Field

The present invention relates to systems that use acoustic energy in the frequency range around one megahertz to clean objects and more particularly to a system for cleaning single objects that uses a crystal attached to a resonator having an elongated wedge shape.

2. Background Information

It is well-known that sound waves in the frequency range of 0.4 to 2.0 megahertz (MHz) can be transmitted into liquids and used to clean particulate matter from damage sensitive substrates. Since this frequency range is predominantly near the megahertz range, the cleaning process is commonly referred to as megasonic cleaning. Among the items that can be cleaned with this process are semiconductor wafers in various stages of the semiconductor device manufacturing process, disk drive media, including compact disks and optical disks, flat panel displays and other sensitive substrates.

Megasonic acoustic energy is generally created by exciting a crystal with radio frequency AC voltage. The acoustical energy generated by the crystal is passed through an energy transmitting member (a resonator) and into a cleaning fluid. Frequently, the energy transmitting member is a wall of the vessel that holds the cleaning fluid, and a plurality of objects are placed in the vessel for cleaning. For example, U.S. Pat. No. 5,355,048, discloses a megasonic transducer comprised of a piezoelectric crystal attached to a quartz window by several attachment layers. The megasonic transducer operates at approximately 850 KHz. Similarly, U.S. Pat. No. 4,804,007 discloses a megasonic transducer in which energy transmitting members comprised of quartz, sapphire, boron nitride, stainless steel or tantalum are glued to a piezoelectric crystal using epoxy.

It is also known that megasonic cleaning systems can be used to clean single objects, such as individual semiconductor wafers. For example, U.S. Pat. No. 6,021,785 discloses the use of a small ultrasonic transmitter positioned horizontally adjacent to the surface of a rotating wafer. A stream of water is ejected onto the surface of the wafer and used to both couple the acoustic energy to the surface of the disk for sonic cleaning and to carry away dislodged particles. Similarly, U.S. Pat. No. 6,039,059 discloses the use of a solid cylindrically-shaped probe that is placed close to a surface of a wafer while cleaning fluid is sprayed onto the wafer and megasonic energy is used to excite the probe. In another example, U.S. Pat. No. 6,021,789 discloses a single wafer cleaning system that uses a plurality of transducers arranged in a line. A liquid is applied to a surface of the wafer and the transducers are operated so as to produce a progressive megasonic wave that carries dislodged particles out to the edge of the wafer.

A problem with megasonic transducers of the prior art is that the acoustic power that can be generated by the megasonic transducer in the cleaning solution is limited to about 10 watts per $cm^2$ of active piezoelectric surface without supplying additional cooling to the transducer. For this reason, most megasonic power sources have their output limited, require liquid or forced air cooling or are designed for a fixed output to the piezoelectric transducer or transducers. Typically, fixed output systems are limited to powers of 7–8 watts/$cm^2$. This limits the amount of energy that can be transmitted to the cleaning solution. If more power is applied to the transducer, the crystal can heat up to the point where it becomes less effective at transmitting energy into the cleaning solution. This is caused either by nearing the maximum operating temperature of the crystal or, more often, by reaching the failure temperature of the material used to attach the crystal to the energy transmitting member.

SUMMARY OF THE PRESENT INVENTION

Briefly, the present invention is a megasonic cleaning system comprised of an elongated wedge-shaped resonator and an acoustic energy generating means for generating acoustic energy. Typically, the acoustic energy generating means comprises one or more piezoelectric crystals capable of generating acoustic energy in the frequency range of 0.4 to 2.0 MHz when power is applied to the crystal. The piezoelectric crystal is attached to the resonator by a tin, indium, epoxy or glue layer.

The resonator comprises a material selected from the group consisting of quartz, sapphire, silicon carbide, silicon nitride, ceramics, aluminum, stainless steel and materials coated with inert substances. The resonator is a thin wedge of material that is elongated in the horizontal direction. A cross section of the resonator taken perpendicular to the horizontal direction is trapezoidal in shape, with the parallel sides of the trapezoid forming the top and bottom of the resonator, and the nonparallel sides of the trapezoid forming the angled walls of the resonator. The crystal is mounted on the proximal (top) side and the object to be cleaned is positioned adjacent to the distal (bottom) side of the resonator. The angled walls of the resonator focus the acoustic energy at the distal side of the resonator. Since the resonator is elongated, cleaning occurs along the length of the resonator adjacent to the distal side.

DETAILED DESCRIPTION OF THE INVENTION

Figure 1:
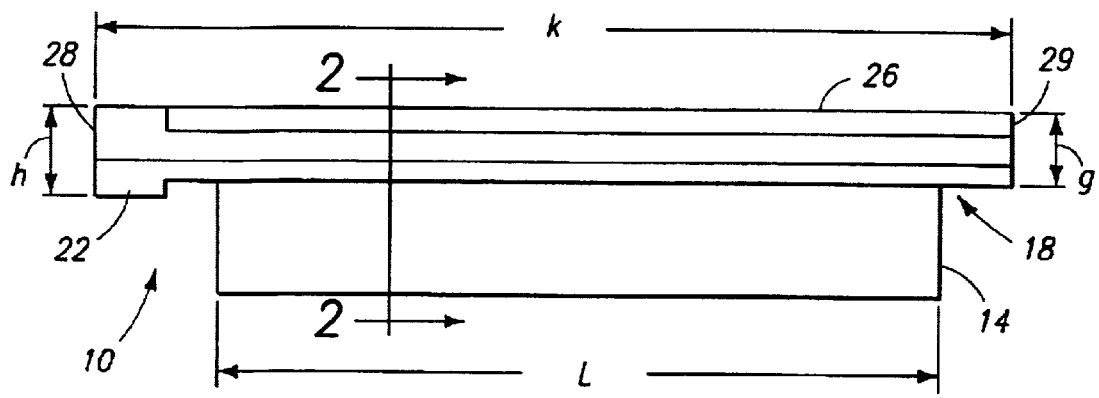
FIG. 1 is a side view of the acoustic transducer according to the present invention.

FIG. 1 illustrates an acoustic transducer 10 comprised of a resonator 14 and a transducer housing 18. The housing 18 comprises a body 22 and a cover plate 26. In the preferred embodiment, the housing 18 is made from stainless steel, but other materials such as plastics, ceramics, quartz or aluminum can be used. In a representative configuration, the resonator has a length "L" and the housing has a length "k". A first end 28 of the housing 18 has a height "h" and a second end 29 of the housing 18 has a height "g".

Figure 2:
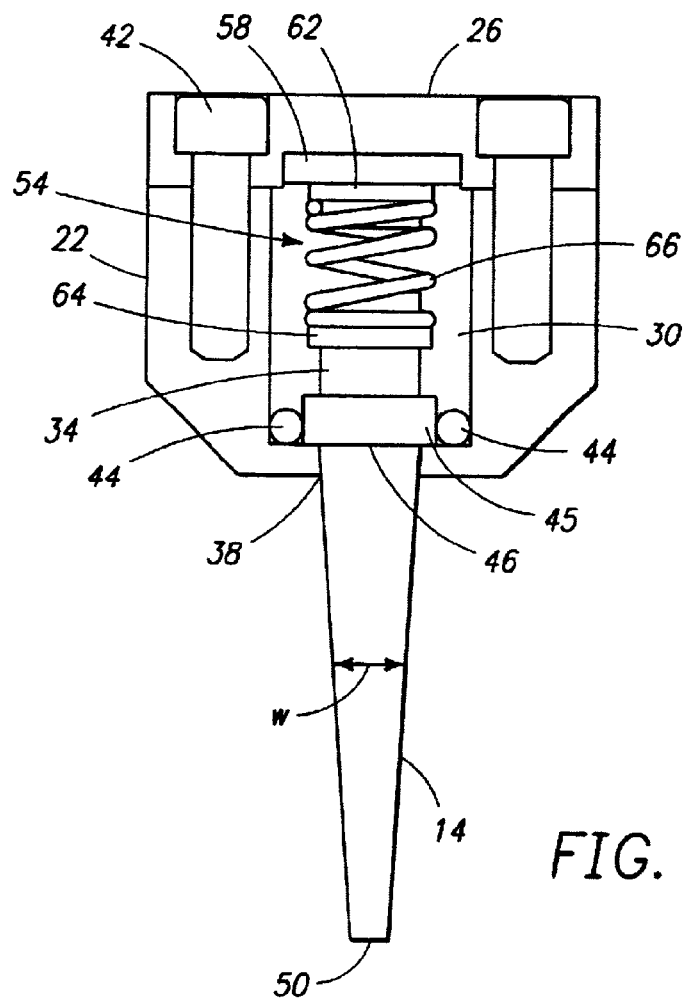
FIG. 2 is a cross-sectional view of the acoustic transducer taken along the line 2—2 of FIG. 1.

FIG. 2 illustrates that the body 22 includes a cavity 30 which holds one or more piezoelectric crystals 34. The resonator 14 extends through a slot 38 and up into the body 22 where it is attached to the crystal 34. The cover plate 26 is attached to the body 22 by attachment means 42, such as screws, bolts or other means, so as to form a liquid tight seal over the cavity 30. Preferably, the fit between the resonator 14 the slot 38 is tight enough to prevent liquid from getting into the cavity 30 through the slot 38. A gasket 44 functions to seal the cavity 30 from moisture, and also prevents any contaminants inside the cavity 30 from escaping. In some embodiments, a lip 45 is formed in the resonator 14 to help in sealing the cavity 30.

The resonator 14 includes a proximal end 46 and a distal end 50 and has a width "w". The resonator 14 is said to be tapered because the width "w" is greater at the proximal end 46 than it is at the distal end 50. A first spring connector 54 is positioned between the crystal 34 and a printed circuit board (PCB) 58. The spring connector 54 comprises a base button 62 and a contact button 64 with a spring 66 positioned between the buttons 62 and 64. The spring connector 54 is used to make electrical contact with the crystal 34 as is explained in more detail later.

Figure 3:
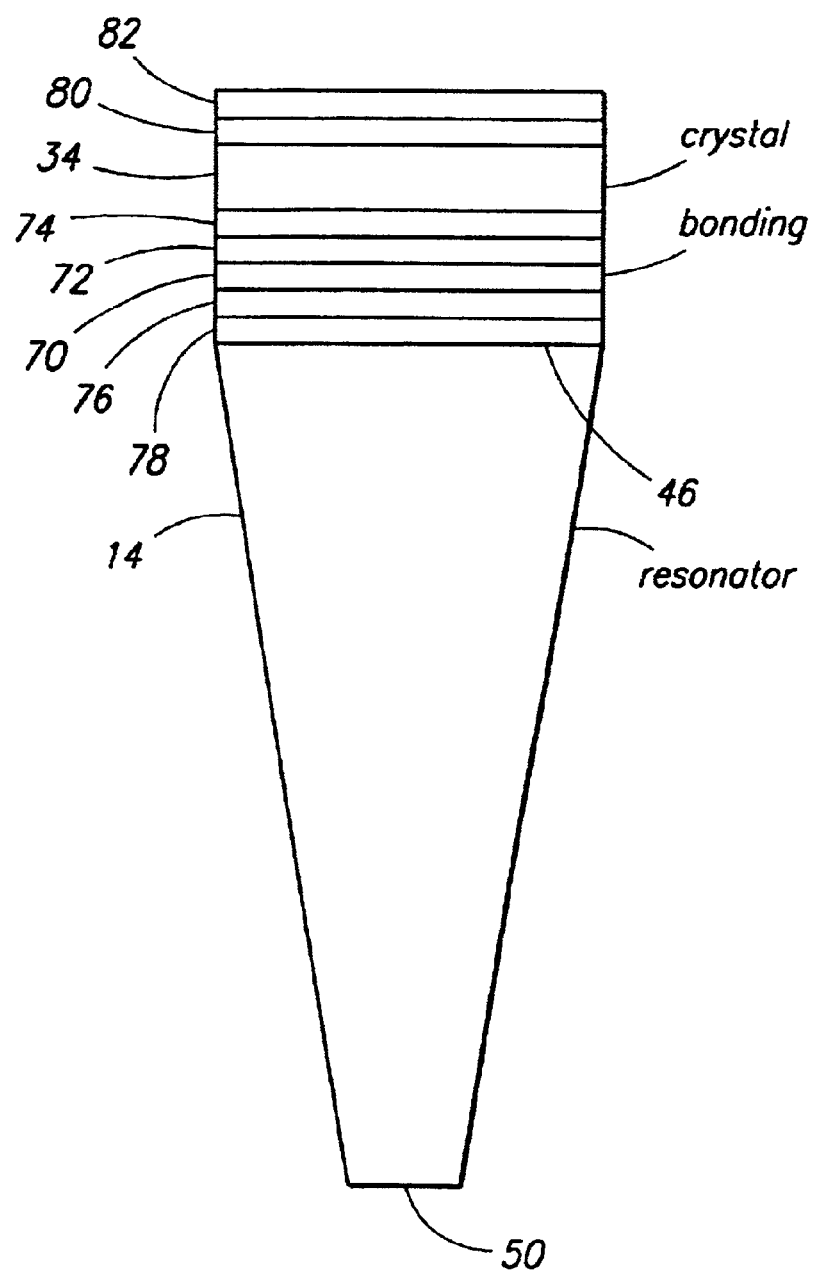
FIG. 3 is a schematic cross-sectional view of an acoustic transducer according to the present invention.

FIG. 3 shows that the resonator 14 is connected to the crystal 34 by a plurality of layers (not to scale). In one embodiment, the crystal 34 is connected to a bonding layer 70 by a first wetting layer 72 and a first adhesion layer 74. The first wetting layer 72 is positioned closest to the bonding layer 70 and the first adhesion layer 74 is positioned closest to the crystal 34. A second wetting layer 76 and a second adhesion layer 78 are positioned between the bonding layer 70 and the resonator 14. The second wetting layer 76 is positioned closest to the bonding layer 70 and the second adhesion layer 78 is positioned closest to the resonator 14. A third adhesion layer 80 is positioned on the opposite side of the crystal 34 from the first adhesion layer 74, and a metal layer 82 is positioned on the third adhesion layer 80.

In FIG. 3, the bonding layer 70 may comprise a solder-like material, such as indium, tin, alloys of indium or alloys of tin. Pure indium works particularly well as the bonding layer 70. The composition and purpose of the other layers shown in FIG. 3 are the same as the layers shown in FIG. 5 of U.S. Pat. No. 6,222,305. Specifically, the first and second wetting layers 72 and 76, may comprise silver and each have a thickness of approximately 5000 Å. However, other metals and/or thicknesses could be used for the wetting layers. The function of the wetting layers 72 and 76 is to provide a wetting surface for the molten indium (or tin) in the bonding layer 70, meaning that the wetting layers help the bonding layer 70 adhere to the first adhesion layer 74 and the second adhesion layer 78, respectively.

In one embodiment, the first, second and third adhesion layers 74, 78 and 80, each comprise an approximately 5000 Å thick layer of an alloy comprised of chrome and a nickel copper alloy. For example, the layers 74, 78 and 80 may be comprised of 50% chrome and 50% nickel copper alloy. Acceptable nickel copper alloys include the alloys marketed under the trademarks Nickel 400™ or MONEL™. Nickel 400™ and MONEL™ are copper nickel alloys comprised of 32% copper and 68% nickel. However, other materials and/or thicknesses could also be used as the adhesion layers 74, 78 and 80. For example, any or all of the layers 74, 78 and 80 may comprise chromium, including a chromium nickel alloy. The layer 80 is optional and can be eliminated completely. The layer 82 is preferably silver, but may comprise other conductive metals, including nickel or silver alloys.

In the preferred embodiment, the crystal 34 is a piezoelectric crystal such as a crystal comprised of lead zirconate titanate (PZT). However, many other piezoelectric materials such as barium titanate, quartz or polyvinylidene fluoride resin (PVDF), may be used as is well-known in the art.

The transducer 10 is constructed using the basic technique described in U.S. Pat. No. 6,222,305. If tin is used as the bonding layer 70, the higher melting point of tin must be taken into consideration.

Figure 4:
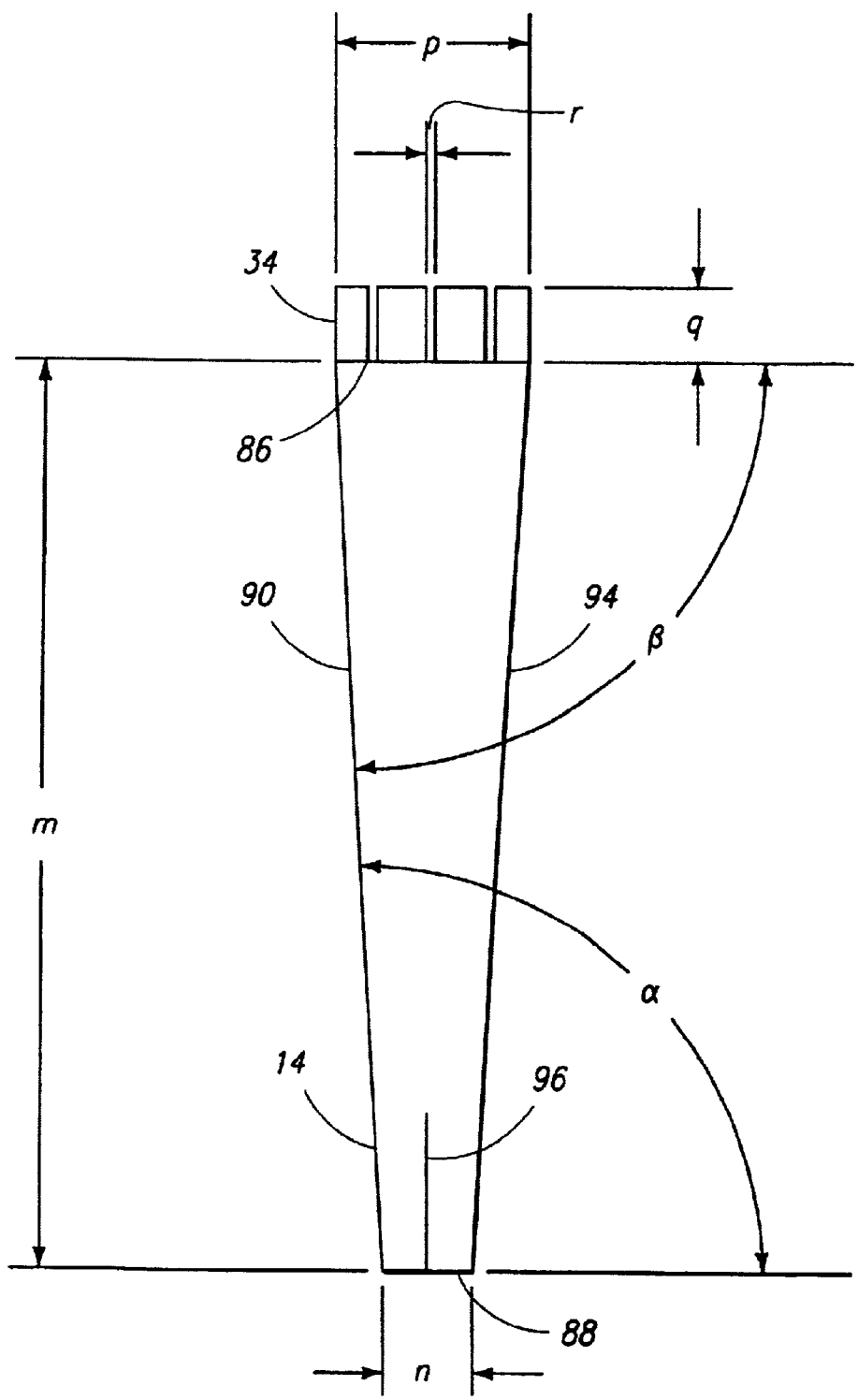
FIG. 4 is a schematic cross-sectional view of an acoustic transducer according to the present invention.

FIG. 4 illustrates the shape of the resonator 14 in the preferred embodiment. Basically, the resonator 14 has a four-sided (quadrilateral) cross section comprised of a proximal side 86 and a distal side 88 that are parallel to each other. A side 90 and a side 94, which are not parallel to each other, complete the quadrilateral. Hence, the cross section is a trapezoid. The resonator 14 has a height "m" that extends from the proximal side 86 to the distal side 88. The distal side 88 has a width "n" that is narrower than a width "p" of the proximal side 86. The side 90 makes an angle α with the distal side 88. Similarly, the side 90 makes an angle β with the proximal side 86. Additionally, the cross section of the resonator 14 is symmetrical about a centerline 96 that bisects the distal side 88 and the proximal side 86. The crystal 34 has a height "q".

In the transducer 10, the shape of the resonator 14 is very important. The resonator 14 is designed so that acoustic energy is focused on the distal end 50 (i.e. is emitted from the distal end 50 with high efficiency, ideally in the range of 50 to 70%). The trapezoidal cross section of the resonator 14 (shown in FIG. 4) causes the input power per unit area at the proximal end 46 to be focused by the angled sides 90 and 94 (shown in FIG. 4) to a smaller area at the distal end 50, thereby creating a larger output power per unit area from the distal end 50. Also, typically the height "m" of the resonator 14 (shown in FIG. 4) is chosen so as to minimize reflectance of acoustic energy by the resonator, such as by making "m" a multiple of one-half of the wavelength of the acoustic energy emitted by the crystal 34.

In FIG. 4, the crystal 34 is shown divided into four equal sections with a space 98 separating each section. The space 98 has a width "r". It is not necessary to divide the crystal 34 in this manner. A solid crystal 34, such as is shown in FIG. 3, is used in the preferred embodiment. However, inclusion of the spaces 98 in the crystal 34 offers the benefit of simultaneous excitation of each individual crystal segment without coupling of acoustic modes in the horizontal direction. Alternatively, the individual crystal segments can be excited sequentially.

In examining FIG. 4, several minor variations in the trapezoidal shape can be considered. In one case, as the width "n" becomes small, the distal side 88 becomes more point-like. However, since the distal end 88 will always have a finite width "n", a trapezoid shape is still present. In another case, the resonator 14 may include the lip 45 (shown in FIG. 2). However, examination of FIG. 2 shows that the trapezoid shape still exists below the lip 45. In one embodiment, where the resonator 14 comprises sapphire, representative values for the parameters illustrated in FIG. 4 are as follows: m=1.0 inch (2.564 cm); n=0.08 inch (2.05 mm); p=0.19 inch (4.87 mm); q=0.08 inch (2.05 mm); angle α=93.15 degrees; and angle β=86.85 degrees. These values are obtained by finite element analysis and are desirable when the sound energy being transmitted from the distal end 50 needs to be maximized. In cases where the crystal 34 is divided as shown in FIG. 4, the value r=0.01 inch (0.2564 mm). It should be appreciated that the transducer 10 will work with other values for these parameters. Furthermore, in other situations, optimum performance of the transducer 10 may be obtained using different values for the parameters.

Figure 5:
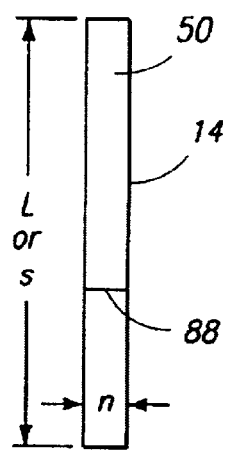
FIG. 5 is a bottom view of a resonator according to the present invention.

FIG. 5 illustrates that the distal end 50 comprises a bottom face of the resonator 14 that is rectangular in shape. The rectangle formed by the distal end 50 has the length "L" (also shown in FIG. 1) or the length "s" (shown in FIG. 8), and the width "n" (also shown in FIG. 4). Additionally, the distal end 50 includes the distal side 88.

Figure 6:
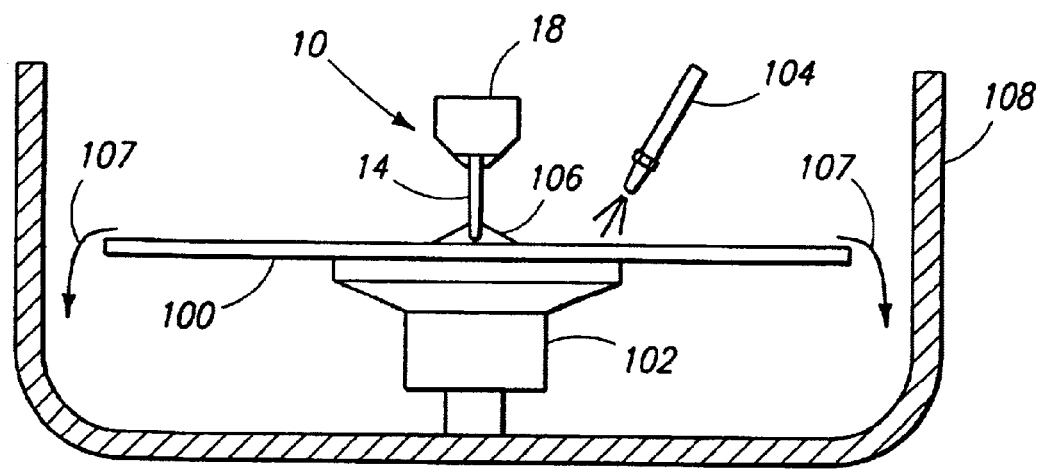
FIG. 6 is a schematic side view of a megasonic cleaning system according to the present invention.

FIG. 6 illustrates one use for the transducer 10. In FIG. 6, an object 100, such as a semiconductor wafer, is positioned on a platform 102 that can be rotated. A process fluid source 104, such as a nozzle, delivers process fluid to the surface of the object 100. The platform 102 is rotated causing the object 100 to rotate. The rotation causes the process fluid on the surface of the object to spread out and form a film 106 of process fluid. The transducer 10 is positioned a small distance (e.g. 0.1 to 1.0 millimeters) above the surface of the object 100 on the same side of the object that is covered with the film 106.

Specifically, the distal end 50 of the resonator 14 is positioned over the surface of the object 100. Power is supplied to the transducer 10 causing acoustic energy to be transmitted from the distal end 50 and into the film 106 of process fluid. The acoustic energy in the film 106 causes the surface of the object 100 to be cleaned of small particles. For example, if the object 100 is a semiconductor wafer (e.g. silicon or gallium arsenide), particles in the size range of 0.09 to 5.0 micrometers can be cleaned from its surface. The rotation of the object 100 causes the process fluid and the particles to be spun off the ends of the object 100 as is indicated by the arrows 107. The process fluid and the particles are captured by a container 108.

The transducer 10 is especially useful for cleaning individual items that are difficult to clean in a batch process. Such items include large semiconductor wafers such as those having a diameter of three hundred millimeters or more, semiconductor wafers from a low production run, such as for custom made or experimental chips, flat panel displays, and other large flat substrates.

In practice, different process fluids are used for different cleaning tasks. The exact composition of many process fluids is proprietary to the companies that manufacture the fluids. However, typical process fluids include distilled water, aqueous solutions of ammonium hydroxide, hydrogen peroxide, hydrochloric acid, nitric acid, acetic acid, or hydrofluoric acid, and combinations of these reagents.

Depending upon the requirements of a particular cleaning task, the composition of the resonator 14 is selected from a group of chemically inert materials. For example, inert materials that work well as the resonator 14 include sapphire, quartz, silicon carbide, silicon nitride, ceramics, stainless steel and aluminum. Additionally, the resonator 14 can be made chemically inert by coating a non-inert material with a chemically inert material such as Teflon™, Halar™, Kynar™ or PFA. Chemical inertness is desired because it is unacceptable for the resonator 14 to chemically react with the cleaning fluid. Thus, the material used as the resonator 14 is usually dictated, at least in part, by the nature of the cleaning fluid. Sapphire is a desirable material for the resonator 14 when the items to be cleaned by the megasonic cleaning apparatus require parts per trillion purity. For example, semiconductor wafers require this type of purity. A hydrofluoric acid (HF) based cleaning fluid might be used in a cleaning process of this type for semiconductor wafers.

The resonator 14 must also be able to transmit the acoustic energy generated by the crystal 34 into the fluid. Therefore, the acoustic properties of the resonator 14 are important. Generally, it is desirable that the acoustic impedance of the resonator 14 be between the acoustic impedance of the piezoelectric crystal 34 and the acoustic impedance of the process fluid. Preferably, the closer the acoustic impedance of the resonator 14 is to the acoustic impedance of the process fluid, the better.

Figure 7:
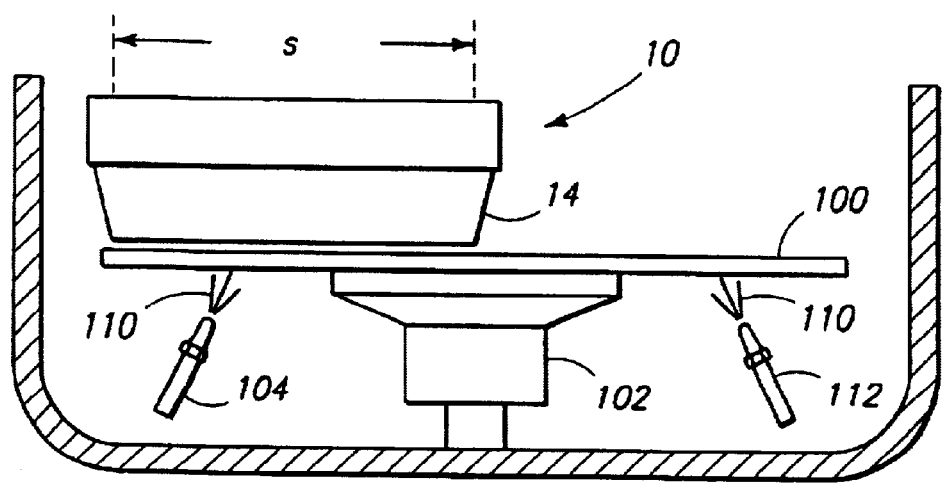
FIG. 7 is another schematic side view of a megasonic cleaning system according to the present invention.

FIG. 7 shows that the transducer 10 can be positioned on the opposite side of the object 100 from the process fluid source 104 and still clean the object 100. In this case the cleaning occurs on the side of the object 100 adjacent to the process fluid source 104. Basically, acoustic energy from the resonator 14 is transmitted through the object 100 and into a stream 110 of process fluid causing the cleaning to occur. Since gravity tends to cause the process fluid to fall away from the object 100 in this embodiment, at least one process fluid source 104 should be positioned directed under the transducer 10. In FIG. 7, the length "s" of the resonator 14 is selected to equal the radius of the object 100. The length "s" could also be selected to equal the diameter of the object 100 to increase the degree of cleaning. In this case at least one process fluid source 112 is positioned to deliver process fluid under the extended length of the resonator 14.

Figure 8:
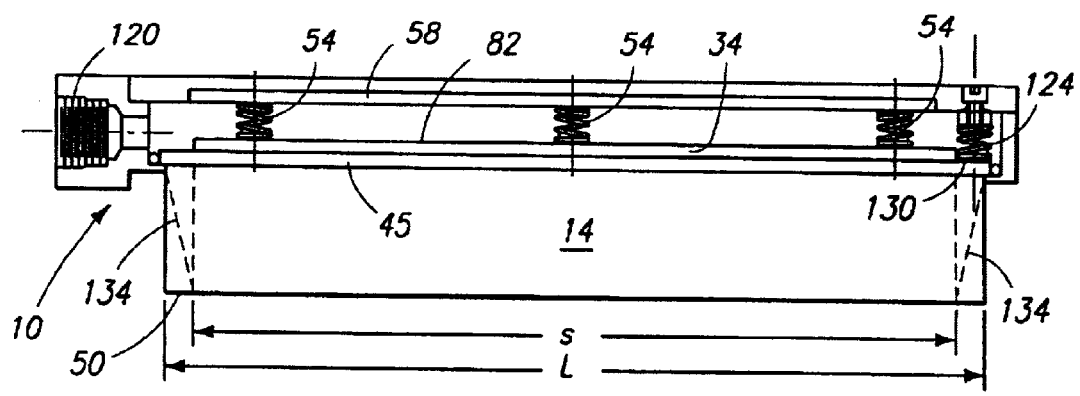
FIG. 8 is a side view of an acoustic transducer according to the present invention.

FIG. 8 illustrates the system that is used to create a voltage differential across the crystal 34, thereby generating acoustic energy. The power for driving the crystal 34 is provided by a radiofrequency (RF) generator (not shown), such as a 1000 watt RF generator. Preferably, the RF voltage applied to the crystal has a frequency in the range of approximately 925 MHz. However, RF voltages in the range of approximately 0.4 to 2.0 MHz can be used. The RF power is delivered to the transducer 10 through a coaxial cable that connects to a standard BNC connector that fits in a threaded aperture 120. The RF voltage is delivered to the crystal 34 by a plurality of the first spring connectors 54 and one or more second spring connectors 124. The BNC connector is electrically connected to the printed circuit board PCB 58 which allows the RF voltage to be delivered to the connectors 54 and 124.

The second spring connectors 124 provide an electrical connection between the PCB 58 and the layer 76 (shown in FIG. 3). The first spring connectors 54 provide an electrical connection between the PCB 58 and the layer 82 (shown in FIG. 3) on the crystal 34. With this arrangement, the plurality of first spring connectors 54 provide the active connection to the RF generator and the second spring connectors 124 provide the ground connection to the RF generator.

The transducer 10 includes a step-region 130. The step region 130 is an electrically conductive region on the resonator 14, such as the layer 76, that can be contacted by the second spring connector 124. In the embodiment shown in FIG. 8, the step region 130 is formed by making the resonator 14 longer than the crystal 34. Hence, if the resonator 14 has the total length "L" (shown in FIGS. 1 and 8), the length "L" includes a shorter length "s" which corresponds to the length of the resonator 14 that is underneath the crystal 34. This is important because acoustic energy is emitted predominantly from the distal end 50 along the length "s". The resonator 14 has a uniform shape at least over the entire length "s", meaning that the resonator 14 has the shape of the trapezoidal cross section shown in FIG. 4 over the length "s".

In alternate embodiments, the resonator 14 may be tapered on its terminal ends (as indicated by the dashed lines 134) so that the distal end 50 has a total length equal to the length "s".

Since all of the layers between the layer 76 and the crystal 34 are electrically conductive (i.e. the layers 70, 72 and 74), contact with the step region 130 is electrically equivalent to contact with the surface of the crystal 34 that is adjacent to the resonator 14. The first spring connectors 54 make electrical contact with the metal layer 82 to complete the circuit for driving the crystal 34.

Figure 9:
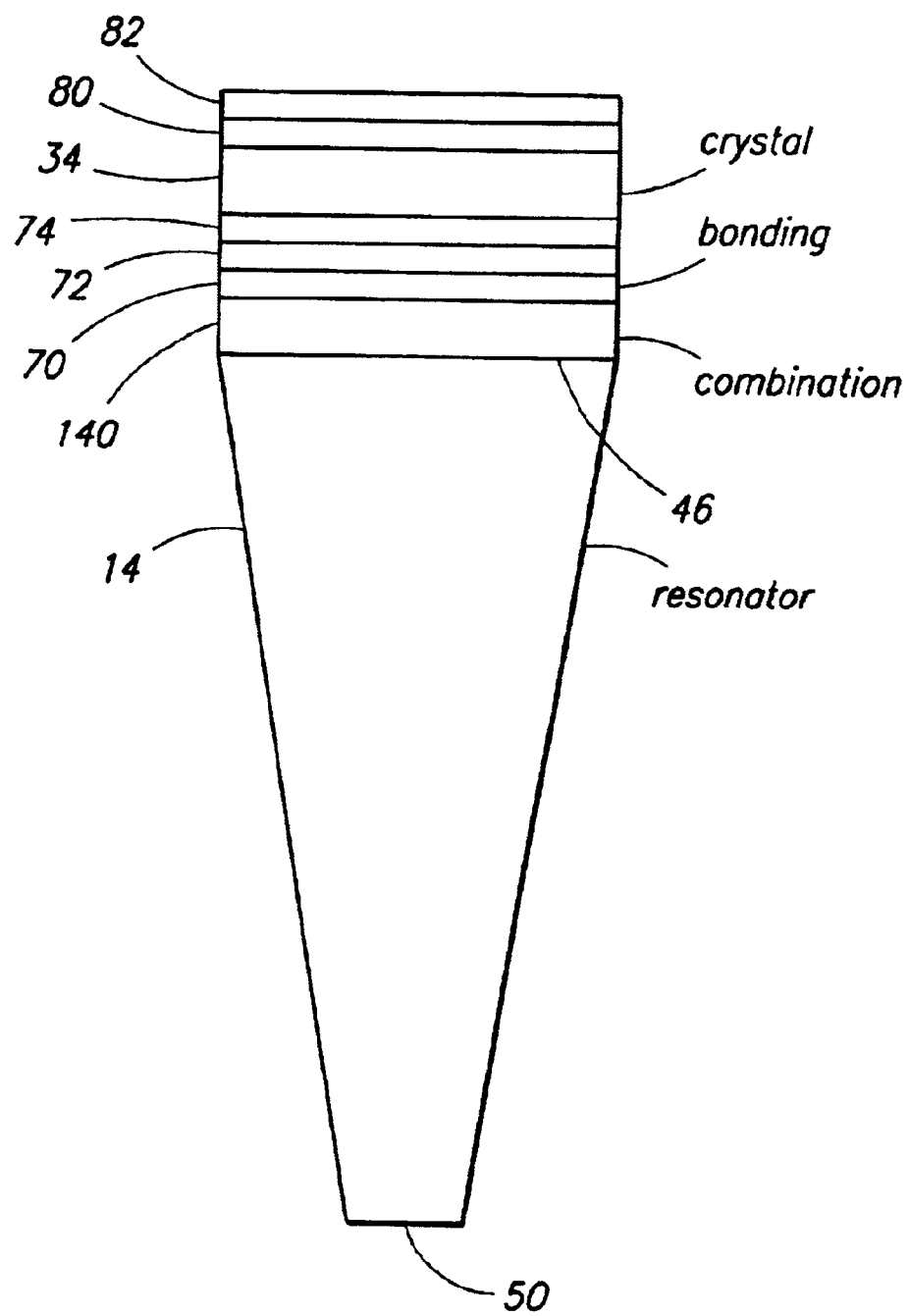
FIG. 9 is a schematic cross-sectional view of an acoustic transducer according to the present invention.

In addition to the layers shown in FIG. 3, it should be appreciated that there are many ways of connecting the resonator 14 to the crystal 34. For example, FIG. 9 shows an embodiment in which the resonator 14 is connected to the crystal 34 using a combination layer 140 in place of the layers 76 and 78. Layers in FIG. 9 that are identical to the layers described previously with respect to FIG. 3 are identified with the same reference numerals used in FIG. 3. The combination layer 140 functions at least to facilitate attachment of the bonding layer 70 to the resonator 14.

In the preferred embodiment, the combination layer 140 is a conductive silver emulsion (paste) that is applied to the resonator 14. An acceptable emulsion is the commercially available product referred to as the 2617D low temperature silver conductor, available from EMCA-REMAX Products, of Montgomeryville, Pa. The layer 140 is applied directly to the resonator 14 using screen printing techniques. In this embodiment, a region of the layer 140 would be used in the step region 130 (shown in FIG. 8) to contact the spring connector 124.

In this embodiment, the layer 140 is applied to the resonator 14 as follows: The outside surface of the resonator 14 is cleaned, such as by bead blasting. A 325 mesh stainless steel screen is placed over the outside surface of the resonator 14 and an approximately 0.5 mil thick layer of the 2617D low temperature silver conductor paste is coated over the screen. The screen is then removed from the resonator 14 which is then is allowed to air dry at room temperature for two to five minutes. The resonator 14 is then placed in a convection oven and dried at approximately 150° C. for approximately ten minutes. The piezoelectric crystal (or crystals) 34 is then attached to the resonator 14 with the bonding layer 70 using the technique described previously with respect to FIG. 3.

Figure 10:
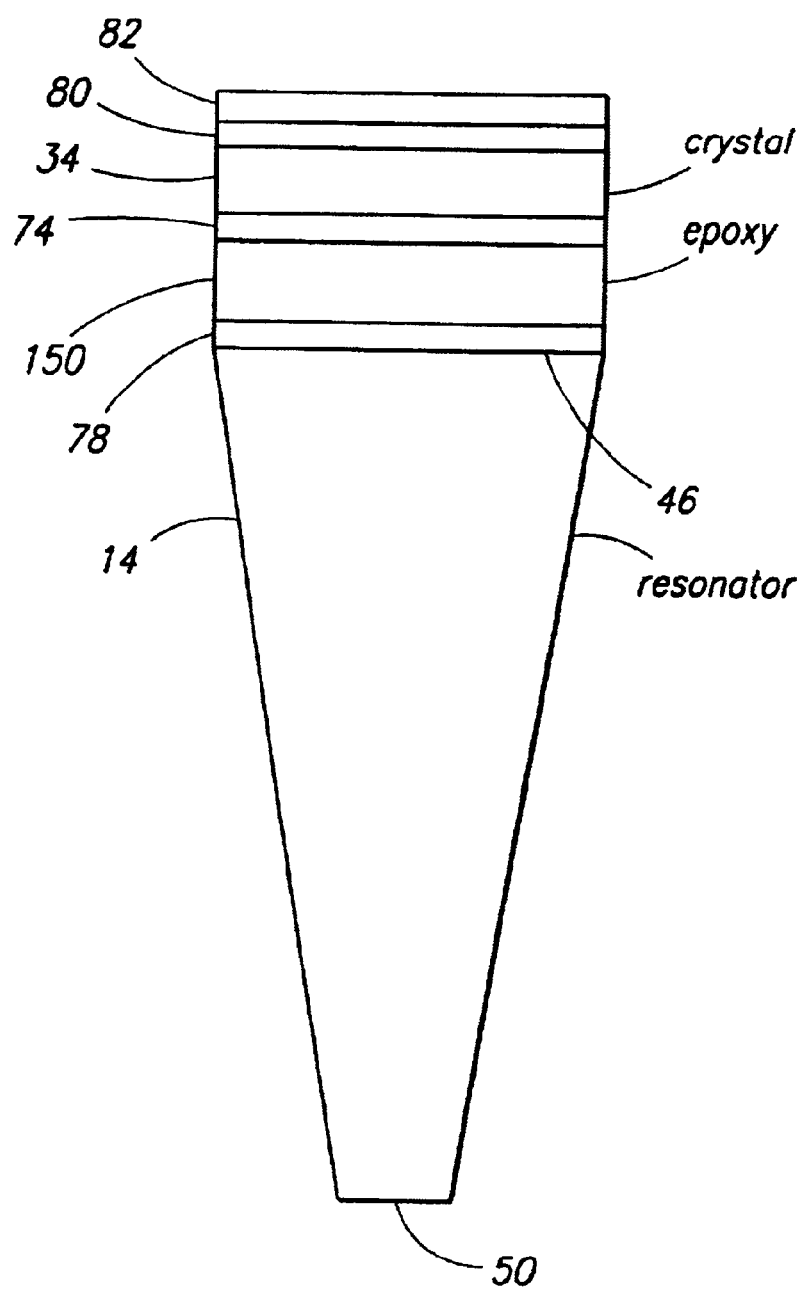
FIG. 10 is a schematic cross-sectional view of an acoustic transducer according to the present invention.

FIG. 10 shows another embodiment in which the resonator 14 is connected to the crystal 34 by an epoxy layer 150. Layers in FIG. 10 that are identical to the layers described previously with respect to FIG. 3 are identified with the same reference numerals used in FIG. 3. In FIG. 10, the epoxy layer 150 replaces the bonding layer 70 described previously. The epoxy layer 150 may comprise any suitable electrically conductive epoxy. In this embodiment, the layer 78 would be used in the step region 130 (shown in FIG. 8) to contact the spring connector 124. In other embodiments, thin silver layers may be positioned on one or both sides of the epoxy layer 150, similar to the wetting layers 72 and 76 discussed in reference to FIG. 3.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. A transducer comprising:

a resonator adapted for use in a cleaning system, the resonator comprising a distal end, a proximal end and a pair of angled walls, the resonator having a length "s", with the distal end forming a face of the resonator in the shape of a rectangle having the length "s" and a width "n", the pair of angled walls extending along the length "s" and being separated by the width "n" at the distal end, with the "n" being approximately two millimeters or more and the face being adapted for positioning adjacent to an time to be cleaned, the resonator having a cross section that has the shape of a trapezoid, the trapezoid having a top side and a bottom side and two nonparallel sides, with the top side being wider than the bottom side and the top side being part of the proximal end and being parallel to the bottom side, and the pair of angled walls forming the two nonparallel sides, and an acoustic energy generating means attached to the proximal end of the resonator for generating acoustic energy in the frequency range of 0.4 to 2.0 MHz, the pair of angled walls focusing the acoustic energy on the distal end and the acoustic energy generating means being positioned over at least part of the face of the resonator.

2. The transducer of claim 1 wherein the resonator comprises a material selected from the group consisting of quartz, sapphire, silicon carbide, silicon nitride, ceramics, aluminum and stainless steel.

3. The transducer of claim 1 wherein the acoustic energy generating means comprises a piezoelectric crystal.

4. A transducer comprising:

a resonator adapted for use in a cleaning system and having a cross section that has the shape of a trapezoid, the trapezoid having a proximal side and a distal side that are parallel, and a first side and a second side that are not parallel, the first side being separated from the second side by a width "w", the width "w" being greater along the proximal side than it is along the distal side, the resonator having a length "s" measured in a direction perpendicular to a plane containing also having a distal end and a proximal end, the distal end comprising a face of the resonator that extends along the entire length "s" and includes the distal end comprising a rectangular face of the resonator having the length "s" and a width "n", the width "n" separating the first side from the second side at the distal end with the width "n" approximately two millimeters or more and the distal end being adapted for positioning adjacent to an item to be cleaned, and the proximal end comprising a face of the resonator the extends parallel to the distal end and includes the proximal side;

a piezoelectric crystal for generating acoustic energy in the frequency range of 0.4 to 2.0 MHz when power is applied to the piezoelectric crystal, the piezoelectric crystal being positioned adjacent to at least part of the proximal end; and a bonding layer positioned between the piezoelectric crystal and the resonator for attaching the piezoelectric crystal to the resonator.

5. The transducer of claim 4 wherein the bonding layer comprises a material selected from the group consisting of indium, tin, indium alloys, tin alloys, ad epoxy.

6. The transducer of claim 4 wherein the bonding layer comprises a material selected from the group consisting of quartz, sapphire, silicon carbide, silicon nitride, ceramics, aluminum and stainless steel.

7. The transducer of claim 4 wherein the piezoelectric crystal comprises lead zirconate titanate.

8. The transducer of claim 4 further comprising:

an adhesion layer positioned in contact with a surface of the resonator; and a wetting layer positioned between the adhesion layer and the bonding layer for helping the bonding layer bond to the adhesion layer.

9. The transducer of claim 8 wherein the adhesion layer comprises chromium and the wetting layer comprises silver.

10. The transducer of claim 4 further comprising a combination layer positioned between the bonding layer and the resonator, the combination layer functioning at least to facilitate attachment of the bonding layer to the resonator.

11. The transducer of claim 10 wherein the combination layer comprises a silver emulsion.

12. The transducer of claim 4 further comprising:

an adhesion layer positioned in contact with a surface of the piezoelectric crystal; and a wetting layer positioned between the adhesion layer and the bonding layer for helping the bonding layer bond to the adhesion layer.

13. The transducer of claim 12 wherein the adhesion layer comprises chromium.

14. The transducer of claim 12 wherein the wetting layer comprises silver.

* * * * *

UNITED STATES PATENT AND TRADEMARK OFFICE
CERTIFICATE OF CORRECTION

| | |
|---|---|
| PATENT NO. | : 7,105,985 B2 |
| APPLICATION NO. | : 09/964596 |
| DATED | : September 12, 2006 |
| INVENTOR(S) | : Beck et al. |

It is certified that error appears in the above-identified patent and that said Letters Patent is hereby corrected as shown below:

Column 4
Line 27, "angle a" should be --angle $\alpha$--;

Column 8
Line 18, "an time" should be --an item--;
Line 47, after "containing" insert --the cross section, the resonator having a uniform shape along the entire length "s", the resonator--;
Line 50, after "includes" insert --the distal side,--;
Line 54, before "approximately" insert --being--.

Column 9
Line 3, "ad" should be --and--;
Line 4, "bonding layer" should be --resonator--.

Signed and Sealed this

Twelfth Day of June, 2007

JON W. DUDAS
*Director of the United States Patent and Trademark Office*